(12) United States Patent
Kapteyn et al.

(10) Patent No.: US 12,085,520 B2
(45) Date of Patent: Sep. 10, 2024

(54) QUANTUM-LIMITED EXTREME ULTRAVIOLET COHERENT DIFFRACTION IMAGING

(71) Applicant: KAPTEYN MURNANE LABORATORIES, INC. DBA KM LABS INC., Boulder, CO (US)

(72) Inventors: Henry C. Kapteyn, Boulder, CO (US); Bin Wang, Boulder, CO (US); Chen-Ting Liao, Boulder, CO (US); Margaret Murnane, Boulder, CO (US)

(73) Assignee: Regents of the Univ of Colorado, Denver, CO (US)

( * ) Notice: Subject to any disclaimer, the term of this patent is extended or adjusted under 35 U.S.C. 154(b) by 434 days.

(21) Appl. No.: 17/423,869

(22) PCT Filed: Jan. 17, 2020

(86) PCT No.: PCT/US2020/014140
§ 371 (c)(1),
(2) Date: Jul. 17, 2021

(87) PCT Pub. No.: WO2020/150634
PCT Pub. Date: Jul. 23, 2020

(65) Prior Publication Data
US 2022/0100094 A1    Mar. 31, 2022

Related U.S. Application Data

(60) Provisional application No. 62/793,653, filed on Jan. 17, 2019.

(51) Int. Cl.
*G01N 21/47* (2006.01)
*G01N 23/20* (2018.01)
(Continued)

(52) U.S. Cl.
CPC ....... *G01N 23/20008* (2013.01); *G01N 23/20* (2013.01); *G01N 23/20091* (2013.01);
(Continued)

(58) Field of Classification Search
CPC ............... G01N 21/47; G01N 21/4707; G01N 21/4709; G01N 23/20; G01N 23/20008;
(Continued)

(56) References Cited

U.S. PATENT DOCUMENTS 9,891,584 B2 *  2/2018  Zhang .................... G01N 23/20
10,088,762 B2 * 10/2018  Witte .................... H05G 2/008
(Continued)

OTHER PUBLICATIONS

KR 10-1322909 B1 (Korea Institute of Science and Technology) Oct. 29, 2013.

*Primary Examiner* — Allen C. Ho
(74) *Attorney, Agent, or Firm* — Macheledt Bales LLP; Jennifer L. Bales

(57) ABSTRACT

Apparatus and methods for coherent diffraction imaging. This is accomplished by acquiring data in a CDI setup with a CMOS or similar detector. The object is illuminated with coherent light such as EUV light which may be pulsed. This generates diffraction patterns which are collected by the detector, either in frames or continuously (by recording the scan position during collection). Pixels in the CDI data are thresholded and set to zero photons if the pixel is below the threshold level. Pixels above the threshold may be set to a value indicating one photon, or multiple thresholds may be used to set pixels values to one photon, two photons, etc. In addition, multiple threshold values may be used to detect different photon energies for illumination at multiple wavelengths.

21 Claims, 5 Drawing Sheets

(51) Int. Cl.
*G01N 23/20008* (2018.01)
*G01N 23/20091* (2018.01)
*G01N 23/205* (2018.01)
*G01N 23/2055* (2018.01)
*G03F 7/00* (2006.01)
*G03F 7/20* (2006.01)

(52) U.S. Cl.
CPC ....... *G01N 23/205* (2013.01); *G01N 23/2055* (2013.01); *G03F 7/2039* (2013.01); *G03F 7/70616* (2013.01); *G01N 2223/1006* (2013.01)

(58) Field of Classification Search
CPC ....... G01N 23/20016; G01N 23/20091; G01N 23/205; G01N 23/2055
USPC .................................................. 378/70–85
See application file for complete search history.

(56) References Cited

U.S. PATENT DOCUMENTS

| | | | | |
|---|---|---|---|---|
| 10,346,964 B2* | 7/2019 | Ebstein | ...................... | G03F 1/84 |
| 10,444,623 B2* | 10/2019 | Ekinci | .............. | G01N 21/95607 |
| 10,754,140 B2* | 8/2020 | Chan | ...................... | G02B 21/02 |
| 11,002,688 B2* | 5/2021 | Ebstein | .................. | G01N 21/95 |
| 11,347,045 B2* | 5/2022 | Cohen | ................ | G02B 21/0084 |
| 11,709,132 B2* | 7/2023 | Tanksalvala | ....... | G01N 21/4795 |
| | | | | 356/237.2 |
| 11,729,345 B2* | 8/2023 | Hammer | ................ | H04N 5/321 |
| | | | | 348/162 |
| 11,885,755 B2* | 1/2024 | Yun | .................... | G01N 23/2076 |

* cited by examiner

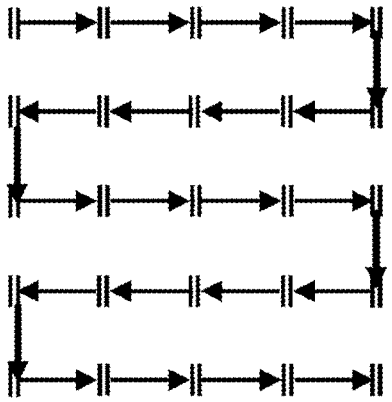
Figure 2C
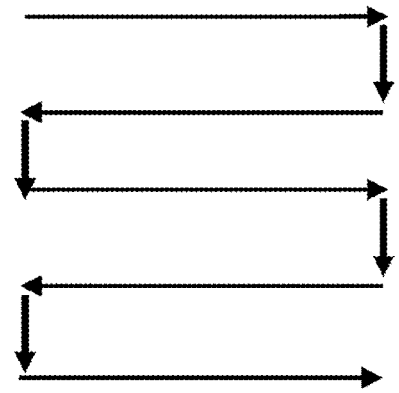
Figure 2D
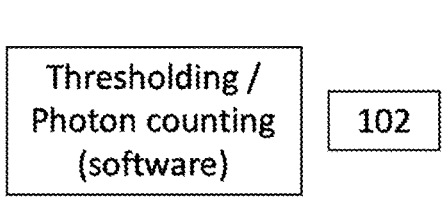
Figure 3
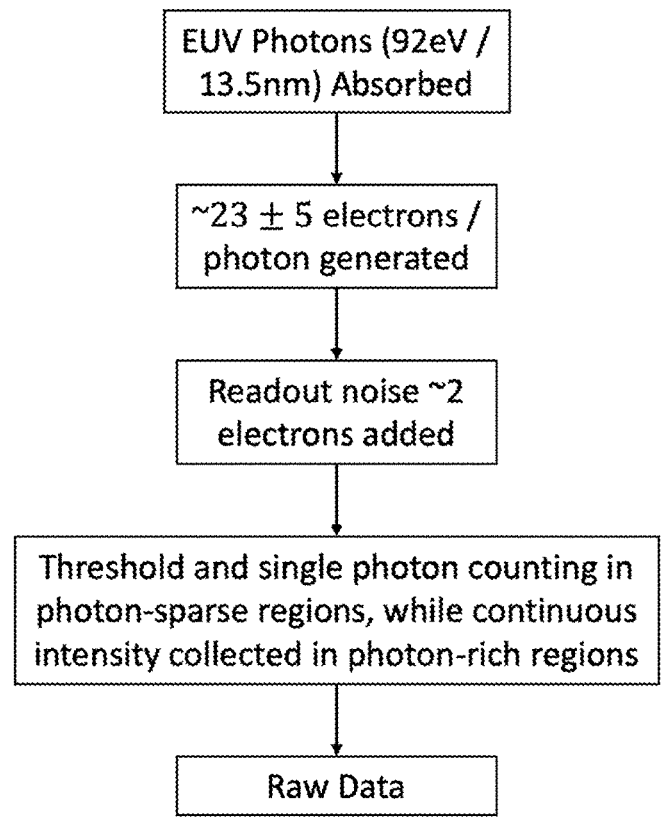

QUANTUM-LIMITED EXTREME ULTRAVIOLET COHERENT DIFFRACTION IMAGING

BACKGROUND OF THE INVENTION

Field of the Invention

The present invention relates to coherent diffraction imaging. In particular, the present invention relates to quantum-limited extended ultraviolet (including x-ray) coherent diffraction imaging.

Discussion of Related Art

Recent work demonstrating imaging using coherent light at 13.5 nm wavelength has yielded the highest-resolution full-field optical imaging as-yet demonstrated in a tabletop-scale setup. A resolution of 12.6 nm has been achieved using Coherent Diffractive Imaging (CDI), which directly detects the light scattered from an object without the use of an imaging optics, then reconstructs an image computationally. CDI techniques have had an outsize impact on extended-ultraviolet (EUV) and x-ray imaging, because prior to CDI, imaging resolution was severely limited by limitations in the imaging optics, which were only capable of ~5-10× the diffraction limit.

By eliminating all optics between the object and the detector, and replacing them with a computational algorithm, it is possible to implement high-numerical aperture (NA), diffraction-limited phase imaging for the first time in this wavelength region. Combined with the use of very short wavelengths, the result is a new nanoimaging technique that can provide fundamentally new nanoimaging capabilities, such as elemental sensitivity and the ability to stroboscopically image dynamics and function. Furthermore, in CDI, virtually every photon scattered from an object can be detected by the imaging detector, making it the most photon efficient form of imaging. Again, for x-ray imaging, dose on the sample is often a critical limitation, particularly for imaging of living systems. Conventional x-ray microscopy quickly kills any sample due to ionizing radiation exposure.

However, one serious limitation of CDI techniques is the limited readout rate of the EUV sensitive charge-coupled device (CCD) detectors. Ptychographic CDI scans the illumination over a sample, taking dozens-to-thousands of individual diffraction images to recover a single reconstructed image. In practice using commercially-available EUV sensitive CCD's, the readout rate is limited to <1 fps. Furthermore, since exposure times to saturate the detector are often <<1 sec, imaging is slow and most of the photon flux from the source is wasted—since the beam is blocked during imager readout.

Virtually all consumer, as well as many scientific imaging applications, have shifted to the use of complementary metal-oxide-semiconductor (CMOS), rather than CCD detectors. Although the fundamental sensitivity mechanism—photon absorption in silicon—is identical between the two types of imagers, in the CMOS imager, a charge-to-voltage conversion is done at each pixel. CMOS imagers use standard fabrication technologies, and are much more amenable to parallel readout, making high frame rates much easier to achieve. Furthermore, more-recently CMOS has exceeded the signal-to-noise (S/N) levels of CCDs, because the signals are amplified in the pixel before leaving the chip. State-of-the-art CMOS detectors have an S/N level of ~2 electrons RMS, and specialized readouts or pixel structures can allow for sub-electron noise; i.e. photoelectron counting. The remaining disadvantage of the CMOS detector—fixed pattern noise due to fluctuations in amplifier gain—has been mitigated by routine pixel-by-pixel calibration and background subtraction.

This mode of operation is important for CDI imaging. The typical CDI diffraction pattern exhibits a very high dynamic range (HDR), much larger than in conventional imaging. In general, CDI images distribute data on the image in "Fourier space", so that fine details correspond to photons scattered at large angles with respect to the specular direction, while large features scatter to small angles.

The extreme example of this is in imaging a completely flat, featureless surface; i.e. a mirror. In this case, the incident illumination is specularly reflected, with all the signal hitting a small region near the center of the detector, with no signal away from the specular region. In contrast, in "real space" imaging using optics to convert the scattered light back into an image, the image would be uniform over the entire surface.

Unfortunately, CMOS technology has not yet been commercialized for imaging in the deep-ultraviolet to x-ray regions of the spectrum. Using CMOS imaging detectors to detect photons in the EUV spectral range, however, does not present any unique challenges—it is technically feasible and simply requires an appropriate imager design. The availability of high-speed CMOS detectors (also called CMOS active pixel detectors) for EUV, furthermore has significant potential to allow for a new regime of high-speed quantum-limited CDI.

A need remains in the art for quantum-limited extended ultraviolet coherent diffraction imaging.

SUMMARY OF THE INVENTION

It is an object of the present invention to provide apparatus and methods for coherent diffraction imaging in the extended ultraviolet to soft x-ray range. This is accomplished by acquiring data in a CDI setup with a CMOS or similar detector. A method of coherent diffraction imaging (CDI) of an object is accomplished by first collecting raw data, by illuminating the object with coherent light (for example extended UV or soft x-ray light), measuring diffraction patterns from the object (from reflection, transmission, or a combination) with a detector such as a CMOS active pixel detector, and generating raw CDI data. Next, the raw CDI data pixels are thresholded. Pixels below a threshold are considered to have detected no photons, while pixels above the threshold are considered to have detected on photon. Another higher threshold may be added, between the two thresholds are considered to have detected on pixels and pixels above the higher threshold are considered to have detected two pixels. and so on.

Generally, some preprocessing is done with the raw CDI data, before thresholding and/or after. This could include background subtraction, antiblooming, removing readout noise, removing bad pixels, and removing cosmic gamma rays, etc. Finally, after thresholding and preprocessing, the CDI data is reconstructed into an image of the object. The reconstruction algorithm might include Poisson denoising.

Generally, the illumination is scanned with respect to the object, by moving the object, the illumination beam, or both. Diffraction patterns are collected during the scanning process. The scanning may stop and start, with data collected while scanning is stopped. A useful embodiment collects many frames of data at each stopping point and adds them together for better accuracy—it is preferable to threshold the pixels before doing this so noise doesn't add up. Alternatively, when the illumination beam is pulsed, it is possible to scan continuously, without stopping. In this case the scanning location is recorded over time, so the imagery accounts for illumination position when reconstruction is done.

BRIEF DESCRIPTION OF THE DRAWINGS

FIGS. 2C and 2D are diagrams illustrating the physical process of FIGS. 2A and 2B respectively.

FIG. 3 is a flow diagram illustrating an example of the thresholding step of FIG. 1 in more detail.

DETAILED DESCRIPTION OF THE PREFERRED EMBODIMENTS

Figure 1:
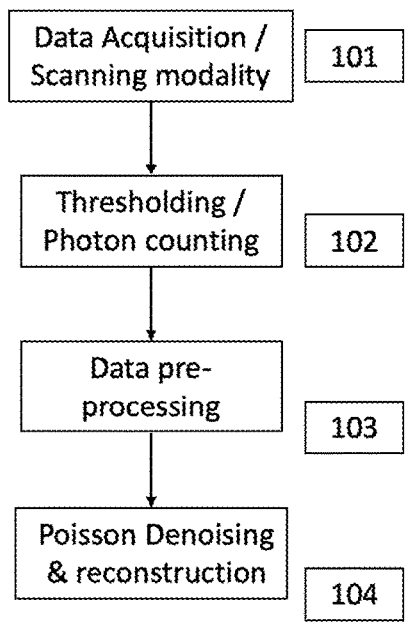
FIG. 1 is a flow diagram showing the overall process of quantum-limited extended ultraviolet coherent diffraction imaging according to the present invention.

FIG. 1 is a flow diagram showing the overall process of quantum-limited extended ultraviolet coherent diffraction imaging according to the present invention. In step 101 data is acquired in a CDI configuration (see FIGS. 2A-D). In step 102, detector pixels are thresholded (see FIG. 3). In step 103, data preprocessing is performed (see FIG. 4). In step 104, the image is reconstructed. FIGS. 6-9 illustrate examples of data acquisition apparatus. Extended ultraviolet range has a wavelength of about 10 nm-200 nm or 10 nm-250 nm, while soft x-ray has a wavelength of about 1 nm-10 nm. Extended ultraviolet range includes extreme UV, generally defined as 10 nm-100 nm.

Various modalities of scanning and data acquisition may be performed in step 101. See FIGS. 2A-2D for examples of scanning and data acquisition modalities.

Thresholding of detector 615 pixels is performed in step 102. FIG. 3 illustrates an example of this process. A typical use of EUV imaging would be to detect small defects in an object 613 that would otherwise be invisible to conventional visible or EUV-wavelength imaging due to their small size. This small size of such a defect means that in CDI imaging, this would correspond to a small number of photons scattered far from the specular direction. At high scattering NA, the photon numbers are small and the detector area is large, while at small scattering angles many photons are scattered into a small region.

Overall, reliable detection of single photons in the "sparse" region of the diffraction data 614 is particularly important for applications such as detecting small defects, and ultrahigh-resolution imaging. In fact, it is well known that in "Fourier imaging", spatial filtering, i.e. actually blocking sections of the detector that correspond to large features (i.e. near the center, specular region of the typical diffraction pattern) can result in edge enhancement, and enhancement of small features such as defects. The concept of "noiseless" detection of single photons, in particular in reference to single channel detectors such as photomultipliers, is well established. The concept here is not that noise does not correspond to probabilistic statistics in the detection of photons—this is inherent to the quantum physics. However, the statistical variation in the detection process, at a single-photon level—can be eliminated by threshold detection of these single photons. A photomultiplier tube is considered a noiseless detector for single photon events, as signal that exceeds threshold is considered a photon detection. Here we extend this concept to the regions of the CMOS active pixel detector where each pixel see <<1 to several photons per exposure, on average.

Here, this concept is brought to CDI imaging (including ptychography) in a way that is specifically suited for use with high repetition-rate EUV sources 603 such as those implemented through high-order harmonic generation 602 of a (pulsed) femtosecond laser system beam 601. A typical number of photons (~50,000, which can vary due to statistics or source fluctuations) would be detected on a pixel array 615 for a single "pulse" of the source; i.e. all ~50,000 photons would arrive at the pixel array essentially simultaneously. In this regime, which is photon-limited for large scattering angles, there is a new, useful, and efficient mode of operation. Saturation of the detector would be avoided since the "brightest" pixel sees at most 100 photons, or a few thousand photoelectrons, which is well-within the dynamic range capability of a typical 10-14 bit CMOS detector ND converter. On the other hand, at high scattering angle, the data would be acquired in a "noiseless" photon counting mode, with digitization such that the majority of pixels will see no signal and will be thresholded to zero photons. Multiple individual frames at the same scan position can then accumulate without adding to statistical noise in the high scattering-angle pixels, and allowing for continuously accumulating data with a dynamic range limited only by exposure time. One very useful embodiment takes a plurality of frames for the same exposure time (e.g. 10 frames up to many thousands of frames, or more narrowly 100 frames up to many thousands of frames) and thresholds the frames before adding them together. Or alternatively, multiple individual frames taken as the beam is scanned to a new position with each shot, can be used directly as individual frames in a ptychography reconstruction that makes use of all the data to improve image fidelity.

Preprocessing is performed in step 103. FIG. 3 illustrates an example of this process. Setting an intensity threshold for "no photon detected" in step 102 allows one, in the case of a sparse, photon-limited data set, to set most of the image to zero values for a pixel. This in many cases allows for preprocessing to compress data sets using, for instance, compressed sensing (CS) based methods or data compression methods. Note that portions of preprocessing may also occur before thresholding. For example, it is common to apply background subtraction to the data, and this is preferably performed before thresholding.

Poisson denoising & reconstruction is performed in step 104. With the inherent noisy data in EUV photon counting ptychography, improved data denoising and ptychographic reconstruction algorithms are useful. Most of the random and structured noise sources in blind x-ray ptychography can be removed by a recently proposed advanced denoising algorithm, which is termed Alternating Direction Method of Multipliers Denoising for Phase Retrieval (ADP). See Chang et al., "Advanced Denoising for X-ray Ptychography," Arxiv, 1811.02081 (2018). Based on a forward scattering model and on a maximum a posteriori estimation combined with the shift-Poisson method for mixed types of noise, the ADP algorithm adds an additional framewise regularization term to further enhance the denoising process and improve the image quality. As for the ptychographic reconstruction algorithm, an improved reconstruction algorithm with a built-in noise model is useful such as the one with an inherent Poisson noise model for photon statistics, combined with hybrid updating strategies in the iterative algorithms which include both the Ordered Subset (namely, ptychographical iterative engine (PIE) algorithm family), and the Scaled Gradient optimization strategies. Possible strategies for denoising would be to use photon detection density over regions of the diffraction data that are sparse to estimate local averaged intensity; i.e. convert imager counts to discrete photons, and then to convert photons back into a more distributed intensity distribution. These statistical averaging methods can replace the original data, or be used in conjunction with the original data, and averaging over regions can be done for amplitude and/or phase data as is most effective.

To-date, reconstruction algorithms for CDI generally assume a continuous intensity distribution in the data. However, consider a hypothetical comparison of a CDI microscope vs a conventional microscope with an imaging lens, in the photon-limited regime. In the real world, both the NA and the efficiency of the lens would result in a loss in signal level and resolution; however, let us assume a perfect, lossless lens. In this case, each photon detected in the CDI imaging mode would also be detected in the conventional imaging mode. Computationally, we can trace the path of this single photon, to remap from the image plane to the diffraction plane on a photon-by-photon basis.

To accomplish this, one still requires phase retrieval in the reconstruction; however, this concept yields a novel approach, where the reconstruction seeks to solve for a continuous optical phase, but a photon-by-photon intensity distribution.

Figure 2A:
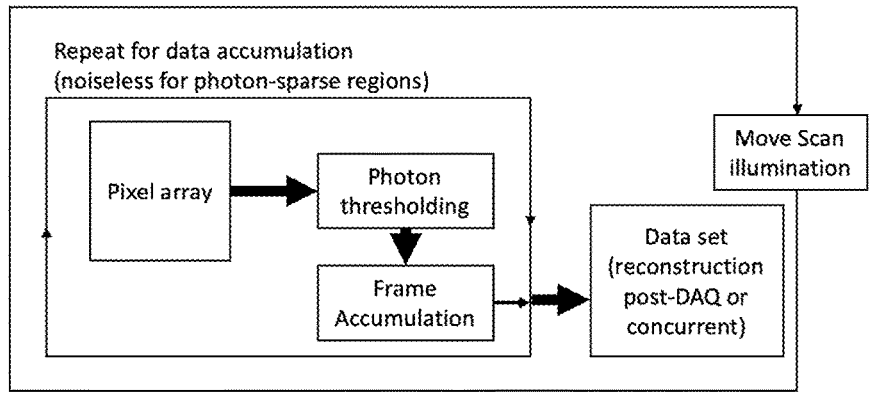
FIGS. 2A and 2B are flow diagrams showing examples of the data acquisition step of FIG. 1 in more detail.
Figure 2B:
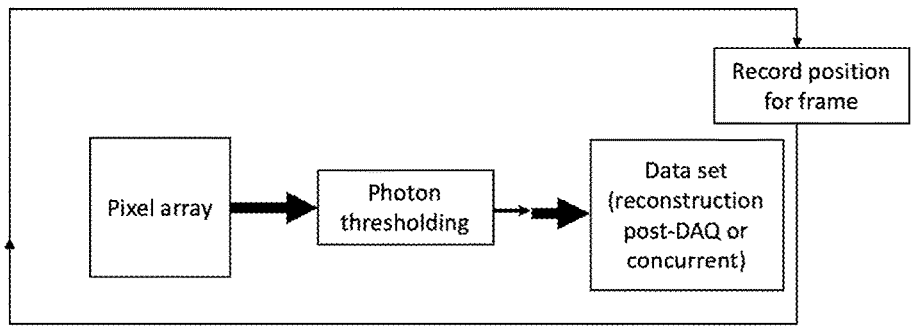

FIGS. 2A and 2B are flow diagrams showing examples of the data acquisition step of FIG. 1 in more detail. FIGS. 2C and 2D are diagrams illustrating the physical process of FIGS. 2A and 2B respectively.

Image acquisition can be accomplished in a number of ways. One could accumulate data over a number of exposure pulses to bring the brightest pixels to near their saturation value as shown in FIGS. 2A and 2C. In FIG. 2A, after accumulation of a single frame, the pixel array data are processed to identify single photons. More than one frame can then be accumulated at a given scan position, with photon counts accumulating as-such in sparse regions, and intensity accumulating as more of a "continuous variable" (though it might still be expressed in mean #photons) to obtain higher dynamic range.

Or, one could accumulate data on a single-shot basis as shown in FIGS. 2B and 2D. The latter is particularly attractive for use with a high-harmonic generation light source. The driving laser typically operates at a repetition rate in the range of 1 kHz to >10 kHz. This is much faster than the readout rate for a CCD detector (typically <1 to ~4 frames per second). However, it is well-matched to the pixel readout rate for CMOS detectors, which has been demonstrated to many thousands fps full array readout rates. When used for shot-by-shot data acquisition, this provides a significant advantage that, in ptychographic CDI, the illumination is scanned over the surface to obtain data at a range of overlapping illumination positions. In current experiments, this requires moving the illumination to a specific position on the surface (either by moving the illumination, or by moving the actual object), stopping, accumulating data, and then moving to a new position. This further slows the acquisition because of the mechanics of this motion. On the other hand, for shot-by-shot frame acquisition, this makes it possible to continuously scan the illumination, recording the position of the beam on a shot-by-shot basis, and pausing data acquisition at-most for short times at the end of a row to raster-scan the image. Although the illustration shows a continuous motion only in one dimension, this can be extended to two-dimensional motion paths (for example, a Lissajous pattern scanning, or a spiral motion). Note that other work has proposed a software fix for continuous scanning with a quasi-continuous source; this modality has intrinsic limits that our approach does not. See Helfenstein et al., "Scanning coherent diffractive imaging methods for actinic extreme ultraviolet mask metrology," Journal of Micro-Nanolithography Mems and Moems 15 (3), 5 (2016).

FIGS. 2C and 2D illustrate the difference between stop-start scanning (FIG. 2C) and continuous scanning (FIG. 2D). Note that the "raster" pattern illustrated here is an over-simplification—often in CDI non-regular scanning modes (ex. Fermat spiral, irregular spacing, etc.) are used to avoid reconstruction artifacts. In FIG. 2C motion of the sample with respect to the beam stops during acquisition, data are accumulated, and then the sample is moved to a new location.

FIG. 2D shows continuous scanning. For use with light sources that are pulsed at repetition-rates where single-shot frame readout is possible, the position of illumination is moved continuously, and the approximate position of the acquisition is recorded at the instant when the pulse of EUV arrives. This allows for fast, continuous scanning and acquisition. The result is a densely-spaced data set, which in its extreme acquires frames at a positional spacing comparable to, or exceeding, the spatial resolution even when the illumination beam is much larger than this.

FIG. 3 is a flow diagram illustrating an example of thresholding step 102 of FIG. 1 in more detail. In the case of widely-used silicon-based detectors, an EUV (detectable) photoelectron is created for every ~4 eV of deposited photon energy. At 13.5 nm wavelength—92 eV photon energy—about 23 photoelectrons will be generated for each detected photon. With achievable readout noise levels of ~2 photoelectrons or less, it is possible to identify single photons absorbed by a detector pixel with high reliability, while at higher exposure levels the pixel count is less precise and forms a "continuous (though obviously still digitized) intensity measurement. Single photon sensitive detection, and in particular the ability to reliably identify pixels that did not absorb a photon allows for digital signal accumulation.

The physics of EUV light absorption in silicon detectors—including both CCD and CMOS imagers—is well known and characterized. For an uncoated, back-thinned device suitable for EUV, photoabsorption is followed by a secondary electron cascade that yields an average of one generated photo-electron for each ~4 eV of deposited energy. Thus, for EUV imaging using 92 eV/13.5 nm wavelength light, each absorbed photon generates ~23±5 electrons assuming sqrt(N) Poisson statistics, where N is the generated electron number. Since the readout noise of a single pixel is ~2 electrons, the readout fluctuation is dominated by the secondary electron multiplication process. This will allow for some degree of "photon counting" in the case of EUV imaging. In-fact, for an incident photon number of <<23 photoelectrons on a single pixel, a CMOS detector can serve to noiselessly count photons. In the case of using such a detector with visible light (wavelength 400-700 nm, photon energy ~2-3 eV), each incident photon can generate only a single photoelectron in a detector pixel, and single photon counting is not possible with current commercial CMOS detector noise levels. The development of visible photon-counting "quanta image sensors" can allow this concept to apply more broadly, and in fact the deterministic nature of photon detection in this case can present a distinct advantage. On the other hand, when used with EUV light as in the present invention, one or more threshold values can be used, against which the pixel analog-to-digital (ND) conversion value is compared to determine whether 0, 1, or 2 photons, etc., were absorbed in this pixel. For higher exposure levels, the statistical variations make the photon counts less precise. However, the technology exists to reliably resolve the number of photons incident on a pixel when the number is low, while also allowing for the accumulation of more "continuously" varying intensity information at higher exposure levels. The simplest manifestation of such a quantization would be to divide the pixel value by the mean number of photoelectrons per EUV photon (determined experimentally from regions where isolated single photons are detected) and then to do an integer rounding. Note that the threshold may be set to different levels for different pixels or in different areas of the detector, for example if the detector sensitivity varies. However, more sophisticated algorithms that set the thresholds for small photon numbers, or that look at neighboring pixels in the photon sparse regions to take into account blooming, are useful in some cases (see FIG. 5). These algorithms can be implemented in software, but also amenable to direct FPGA hardware implementation or GPUs. The data acquisition and reconstruction may be concurrent; i.e. reconstruction can build in accuracy as data sets are added; or sub-regions can be reconstructed as data acquisition continues to scan new regions of the object.

In the simplest manifestation, this thresholding could correspond to 1) background subtraction on each pixel; 2) dividing the pixel value by the expected number of photoelectrons for the illumination wavelength (which can take into account the individual pixel gain), and 3) rounding to the nearest integer. Antiblooming algorithms and more-sophisticated thresholding all would add further refinement.

Figure 4:
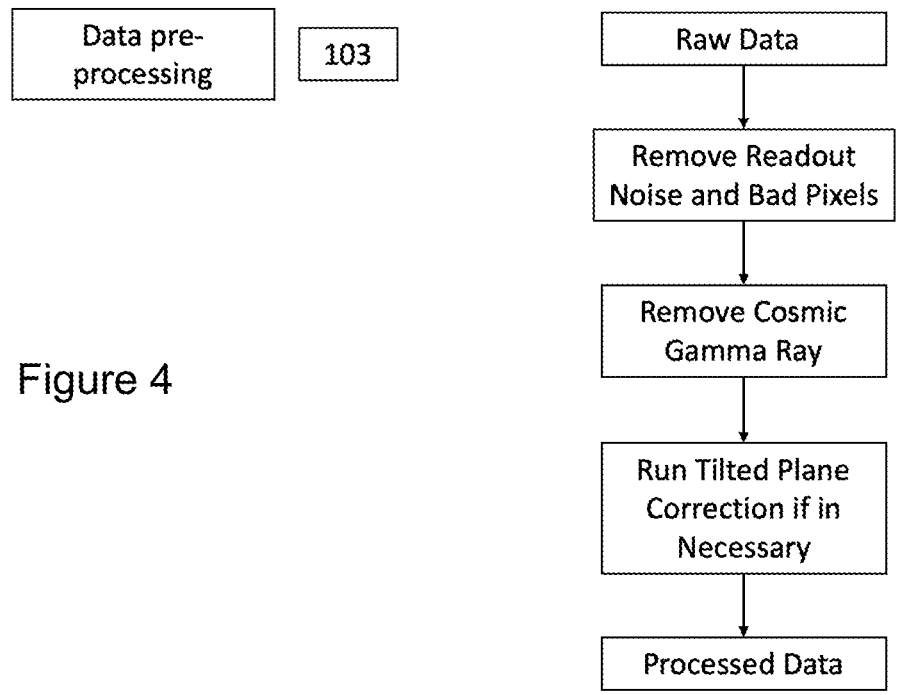
FIG. 4 is a flow diagram illustrating an example of the data preprocessing step of FIG. 1 in more detail.

FIG. 4 is a flow diagram illustrating an example of data preprocessing step 103 of FIG. 1 in more detail. Setting an intensity threshold for "no photon detected" allows one, in the case of a sparse, photon-limited data set, to set most of the image to zero values for a pixel. This in many cases allows for preprocessing to compress data sets using, for instance, compressed sensing (CS) based methods. For example, in the case of a small number of photons detected per frame, the locations of all the nonzero pixels can be read out, skipping the zero pixels. In another case where some pixels may detect more than one photon, these data might also include the pixel intensity/photon number. Other readout options might resemble more of a "data compression" approach, which a series of zero-valued pixels with a zero-run-length code. In any case, since data transfer from the imager 615 will be a performance limiting step due to transfer rates and energy usage, these modes may all play a role, and the system can be adaptive to a variety of environments; i.e. automatically choose the most appropriate data transfer mode. This data processing can be done using FPGA's, GPUs, or more-conventional implementations.

As for the CS methods, one can implement it not only on the optical/EUV/x-ray domain but also on the electronic domain, enabled by the recent advances in CMOS sensor technology to implement smart imaging device with the possibility of on-chip data (pre)processing for CDI. Note that in addition to high speed data preprocessing and acquisition, CS has been used to overcome reconstruction artifacts in CDI due to missing data in the diffraction pattern, and to reach the subwavelength spatial resolution if the sample is sparse in a known basis such as circles on a grid. Machine learning methods are also now being used for CDI image reconstruction.

Figure 5:
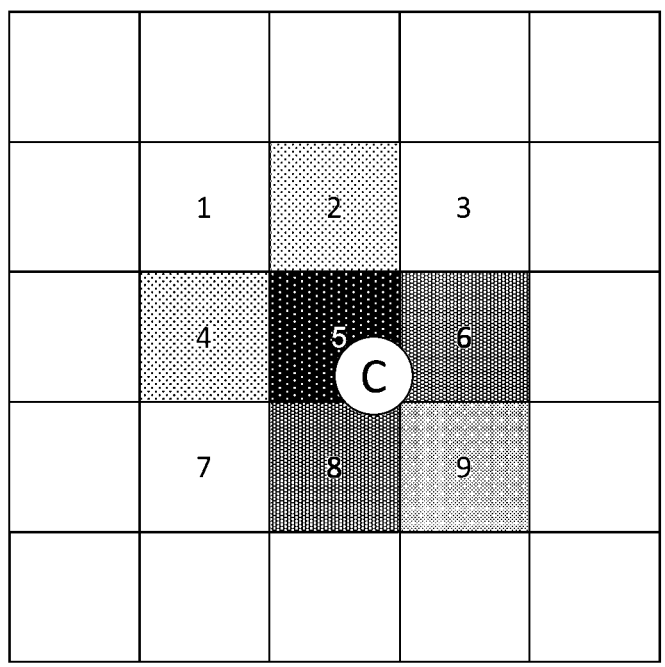
FIG. 5 is a diagram illustrating an antiblooming algorithm which may optionally be performed as part of the data preprocessing step of FIG. 1.

FIG. 5 is a diagram illustrating an antiblooming algorithm which may optionally be performed as part of the data preprocessing step 103 of FIG. 1. This would generally be performed before the thresholding step. Another question that can be an issue with EUV imaging is the case of blooming of single photon events, where the photon is absorbed at a pixel boundary or corner. With a sufficiently high S/N, the readout values of adjacent pixels can be summed together to determine whether such an event might be part of the readout data. Since this type of blooming is a uniform-probability event, blooming may also simply contribute to a decreased quantum efficiency of photon detection. In cases of good photon statistics, the position of the detected photon may be determined with sub-pixel accuracy by an interpolation-based image enhancement technique to determine image centroids.

FIG. 5 shows an isolated region of pixels, with pixel #5 identified as the local maximum. Surrounding pixels that have a photon number readout exceeding a noise threshold might comprise pixels 6, 8, and 9. A weighting of the intensities of these pixels, or fitting of a Gaussian curve can provide sub-pixel spatial resolution (denoted by centroid C). Additionally, the total pixel intensities can be summed to determine the number of photons in this region in case of >1. Fitting to a distribution function is also possible for centroiding. Similar procedures are used for identifying centroid events in direct electron detection in electron microscopes, but have not been to our knowledge employed for photons in the EUV, for imaging. These algorithms can be implemented in software or hardware (i.e. FPGA's).

Figure 6:
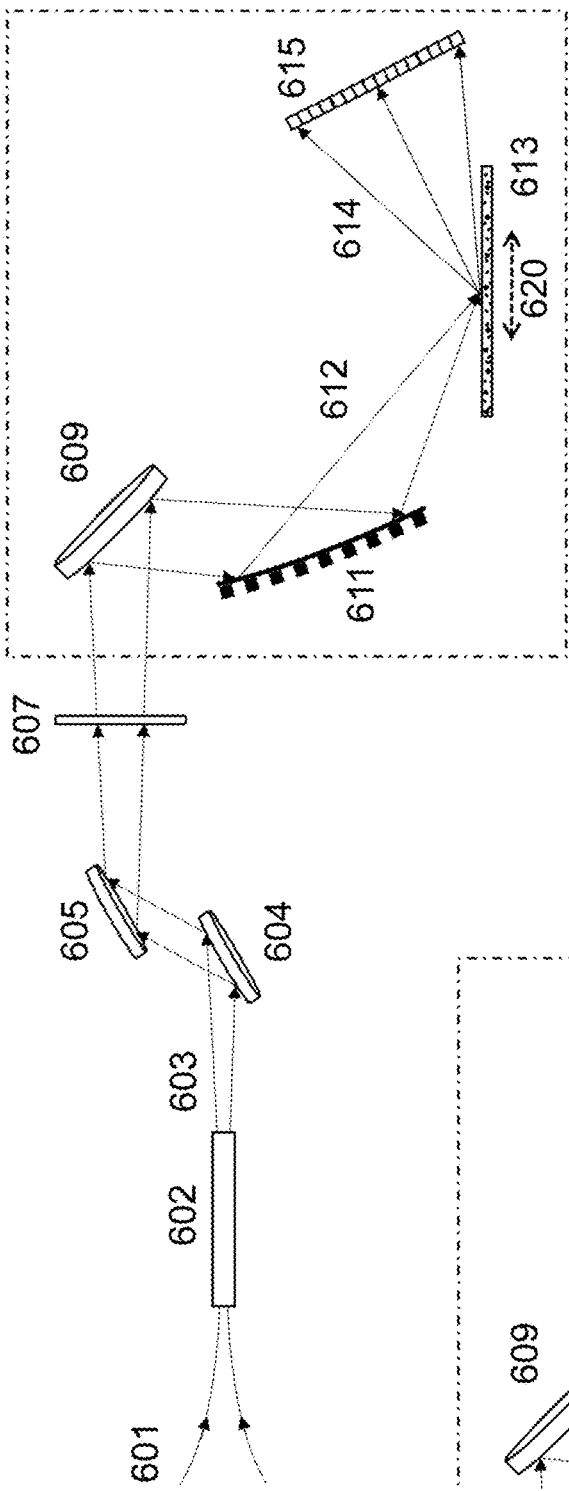
FIG. 6 is a block diagram illustrating a first CDI data acquisition configuration according to the present invention.
Figure 7:
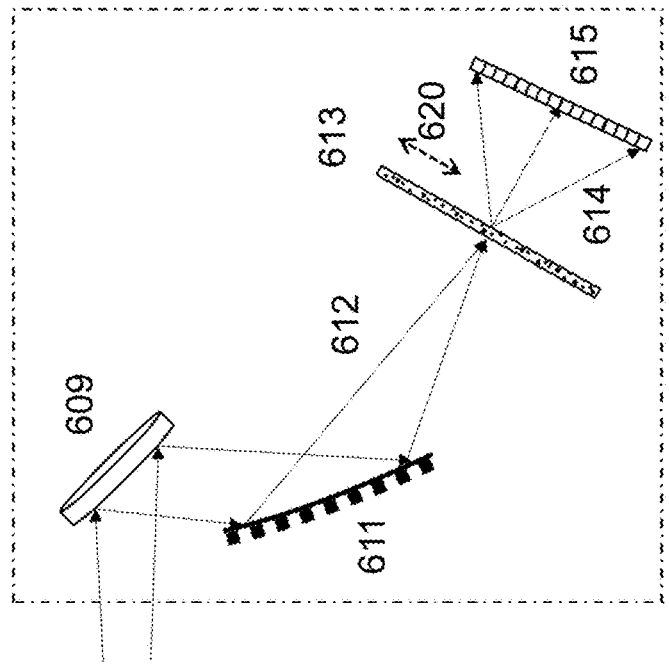
FIG. 7 is a block diagram illustrating a second CDI data acquisition configuration according to the present invention.

FIGS. 6-9 are a block diagrams illustrating CDI data acquisition configurations. FIG. 6 shows a driving laser pulse 601 entering an HHG element 602. 603 is a beam containing the EUV or X-ray beam generated by HHG element 602, along with remaining driving laser light. The remaining driving laser light is preferably removed by rejecting mirrors 604, 605 and filter 607 (e.g. multiple thin metal filters). This prevents damage to optical elements and other complications. Wavelength selecting mirror 609 reflects a single wavelength, as object illumination beam 612 must be coherent and ellipsoidal mirror 611 would reflect broadband light. Thus, object illumination beam 612 comprises a single wavelength EUV/x-ray beam. Object 613 (or alternatively beam 612) is scanned with scanning mechanism 620 (see FIGS. 2A-D). Object illumination beam 612 is reflected off of object 613, and the resulting reflected diffraction pattern 614 is detected by detector 615. The configuration of FIG. 7 is similar, but illumination beam 612 is transmitted through object 613. A combination of reflection and transmission is also possible.

Figure 8:
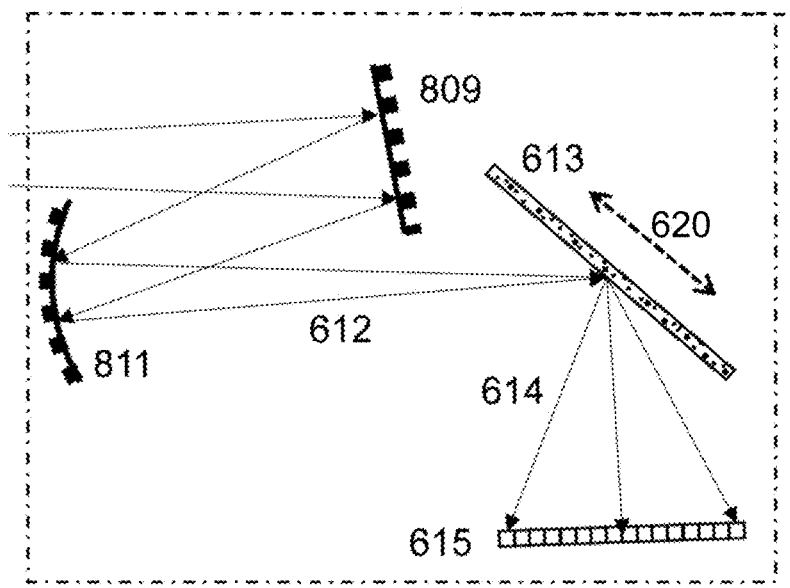
FIG. 8 is a block diagram illustrating a third CDI data acquisition configuration according to the present invention.
Figure 9:
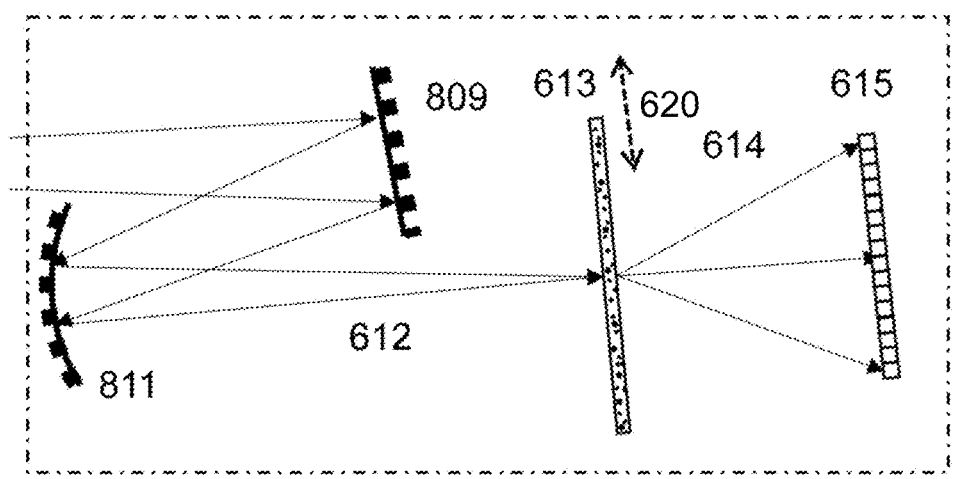
FIG. 9 is a block diagram illustrating a fourth CDI data acquisition configuration according to the present invention.

FIGS. 8 and 9 use flat/spherical mirror pair 809, 811 in place of wavelength selecting mirror 609 in order to select a single wavelength. FIG. 8 shows a reflection mode device while FIG. 9 shows a transmission mode device. Again, these could be combined.

Quantum-Limited Hyperspectral Imaging

The secondary electron generation process that occurs when the detector 615 absorbs a high-energy photon can also be used to determine the energy of the absorbed photon through the total number of detected photons. This can be used for hyperspectral CDI imaging. Generally, the pixel readout noise in determining the energy of the incident photon is low compared with the statistical fluctuation in the secondary electron process. In the case where the photoelectron number statistics are Poisson (which may or may not be the case depending on the dynamics), the fractional energy or bandwidth resolution would relate to $\Delta\lambda/\lambda=\Delta E/E\sim 1/\sqrt{E_{ph}/E_{se}}$ where $E_{ph}$ is the photon energy, while $E_{se}$ is the average energy needed to generate a secondary electron; i.e. ~4 eV for silicon. The energy resolution requirement for CDI imaging depends on a number of factors including the target resolution and illumination spot size. However, generally it has been found that a fractional bandwidth $\Delta E/E\sim 10\%$ can be used effectively in a quasi-monochromatic ptychographic reconstruction. In a special case where a polychromatic or broadband ptychographic reconstruction algorithm is utilized, the fractional bandwidth can be extended to $\Delta E/E\sim 30\%$ or more, at the cost of reduced spatial resolution due to image blur. This resolution could be obtained in the case of the "water window" soft x-ray imaging, with $E_{ph}\sim 300$-500 eV. Future photon detectors such as superconducting transition edge sensor arrays can allow for much higher (~1 eV demonstrated in single-pixel TE sensors) energy resolution.

This mode of operation is especially helpful for soft x-ray microscopy using high harmonic sources. By driving the high harmonic process with mid-infrared lasers, $\lambda \geq 1.5$ μm in wavelength, coherent light in this soft x-ray spectral region can be generated. However, the light emerges as a broadband spectral continuum, and spectral filtering and focusing of this light are very inefficient processes in the soft x-ray region. Normal incidence multilayer reflectors generally have low 10% reflectivity, as well as narrow spectral bandwidth that can be ~1%, dramatically cutting-down the flux. Grazing incidence monochromators may be used as an energy filter, but also tend not to be particularly efficient (~10%). The ability to use the entire spectrum of emission for illumination generally both increases the available flux and allows for a series of hyperspectral images to be obtained in a single data acquisition process by energy labeling individual photons detected with a high-speed frame imager. This modality is effective for data acquisition modes where individual photons are detected by the image sensor; i.e. low overall flux, or the use of high dynamic range data acquisition, using both a very low flux mode where the "bright" regions of the scattered light pattern are imaged, and a maximum flux mode to obtain sensitive acquisition at high NA.

The options for focusing of illumination are also more limiting, and limited, in the soft x-ray region compared with the EUV. Grazing incidence focusing optics can be used to obtain small focal spot size over a broad spectral bandwidth. This can be done either with an ellipsoidal (or similar) shape reflector (very expensive, super-precision optical figure, hard to align), or a two- or more-mirror assembly such as a Kirkpatrick-Baez setup. Both will be limited in spot size by the fact that grazing incidence focusing necessarily means low-NA focusing; i.e. the radius of curvature $r_{focus}\gg\lambda$. However, this only relates to the illumination and thus is feasible. However, zone plates are more commonly used for focusing in the soft x-ray spectral region, since diffractive optics can be used more successfully for relatively tight focusing to $r_{focus}\sim 10\lambda$. In the soft x-ray region, this does allow for a very tight illumination focus. This will tend to increase the usable spectral bandwidth reconstruction.

However, the zone plate focal length is very chromatic, with focal length $f\propto\lambda$. Thus, the focal plane of the illumination will depend on the wavelength. For a broadband source, this could be seen as a serious problem. However, it may also be used to advantage. The relationship between focal point and wavelength is well defined, so that if the photon energy or the spectrum of the illumination is known, it can be related to the size and wavefront of the focal spot illumination (for samples that are thin compared with the confocal parameter of the illumination) or spot-size vs depth. Furthermore, for imaging in the soft x-ray region, thresholding is even more effective than it is in the EUV for multi-frame accumulation with low photon number.

What is claimed is:

1. A method of coherent diffraction imaging (CDI) of an object comprising the steps of:
   (a) collecting raw CDI data generated by:
      (a1) illuminating the object with coherent object illumination light to generate diffraction patterns,
      (a2) measuring the diffraction patterns from the object with a detector array, and
      (a3) generating raw CDI data representing the object based on the measured diffraction patterns;
   (b) thresholding data based on the raw CDI data by applying a first threshold to individual pixels of the data based on the raw CDI data, and setting the data based on the raw CDI data in pixels beneath the first threshold to a value indicating zero detected photons, and setting data based on the raw CDI in pixels above the first threshold to a value indicating a single detected photon;
   (c) preprocessing the raw CDI data; and
   (d) reconstructing imagery of the object from the preprocessed CDI data by running a CDI reconstruction algorithm.

2. The method of claim 1, wherein step (a) further includes the step (a4) of scanning the object with the coherent object illumination light and measuring the diffraction patterns over time.

3. The method of claim 2, wherein:
   the coherent object illumination light is scanned across a region to be imaged, and step (a4) includes the steps of stopping the scanning the object, acquiring the raw CDI data, and resuming the scanning the object;
   wherein step (a2) includes the step of measuring the diffraction patterns while the scanning the object is stopped; and
   wherein step (a3) includes the step of forming individual frames of data based on the raw CDI data from the measured diffraction patterns.

4. The method of claim 3, wherein steps (a2) and (a3) form two frames of the data based on the raw CDI data while the scanning the object is stopped.

5. The method of claim 4, wherein steps (a2) and (a3) form a plurality of frames of the data based on the raw CDI data while the scanning the object is stopped.

6. The method of claim 4, further including the step of accumulating data from the two frames of the data.

7. The method of claim 2, wherein:
   step (a1) illuminates the object with pulses of the coherent object illumination light;
   step (a4) includes the step of continuously scanning one of either the object or the coherent object illumination light; and
   step (a2) includes the step of recording a scanning position while measuring the diffraction patterns.

8. The method of claim 1, wherein step (a1) illuminates the object with the coherent object illumination light having a frequency in an extended ultraviolet range.

9. The method of claim 1, wherein step (a1) illuminates the object with the coherent object illumination light having a frequency in a soft x-ray range.

10. The method of claim 1, wherein step (a2) measures the diffraction patterns from the object with a CMOS active pixel detector.

11. The method of claim 1, wherein step (b) further sets a second threshold, sets pixels between the first threshold and the second threshold to a value indicating a single detected photon at the pixels between the first threshold and the second threshold, and sets pixels above the second threshold to a value indicating two detected photons at the pixels above the second threshold.

12. The method of claim 1, wherein step (c) further includes the step of performing an antiblooming algorithm on the raw CDI data before step (b).

13. The method of claim 1, wherein step (c) further includes the steps of removing a readout noise, removing bad pixels, and removing cosmic gamma rays from the raw CDI data.

14. The method of claim 1, wherein step (d) further includes Poisson denoising.

15. An apparatus for coherent diffraction imaging (CDI) of an object comprising:
   a source of coherent light;
   optics configured to illuminate the object with the coherent light;
   a detector configured to measure diffraction patterns from the illuminated object and generate raw CDI data;
   a processor configured to threshold the raw CDI data by applying a first threshold to individual pixels of the raw CDI data and setting data based on the raw CDI data in pixels beneath the first threshold to zero detected photons, to preprocess the raw CDI data, and to reconstruct imagery of the object from the preprocessed CDI data by running a CDI reconstruction algorithm; and
   a scanning mechanism to scan the coherent light over the object in a pattern.

16. The apparatus of claim 15, wherein the scanning mechanism is configured to stop and restart a scanning, and wherein the processor is further configured to form a plurality of frames of data based on the raw CDI data while the scanning mechanism is stopped.

17. The apparatus of claim 15, wherein the scanning mechanism is configured to scan continuously, and wherein the processor is further configured to periodically record scanning positions.

18. The apparatus of claim 15, wherein the detector comprises a CMOS active pixel detector.

19. The apparatus of claim 15, wherein the source provides extended UV light.

20. The apparatus of claim 15, wherein the source provides soft x-ray light.

21. A method of coherent diffraction imaging (CDI) of an object comprising the steps of:
   (a) collecting raw CDI data generated by:
      (a1) illuminating the object with coherent object illumination light to generate diffraction patterns,
      (a2) measuring the diffraction patterns from the object with a detector array,
      (a3) generating raw CDI data representing the object based on the measured diffraction patterns, and
      (a4) scanning the object with the coherent object illumination light while measuring the diffraction patterns over time;
   (b) thresholding data based on the raw CDI data by applying a first threshold to individual pixels of the data based on the raw CDI data, and setting the data based on the raw CDI data in pixels beneath the first threshold to a value indicating zero detected photons, and setting data based on the raw CDI in pixels above the first threshold to a value indicating a single detected photon;
   (c) preprocessing the raw CDI data; and
   (d) reconstructing imagery of the object from the preprocessed CDI data by running a CDI reconstruction algorithm.

* * * * *